(12) United States Patent
Behrens et al.

(10) Patent No.: US 6,974,489 B2
(45) Date of Patent: Dec. 13, 2005

(54) METHOD AND APPARATUS FOR PROTECTING ELECTRONIC DEVICES AGAINST PARTICULATE INFILTRATION, EXCESSIVE HEAT BUILD-UP, AND FOR IMPLEMENTING EMC SHIELDING

(75) Inventors: Louis Edward Behrens, Rochester, MN (US); Matthew Allen Butterbaugh, Rochester, MN (US); Don A. Gilliland, Rochester, MN (US); Maurice Francis Holahan, Lake City, MN (US); Paul Daniel Pederson, Jr., Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 10/687,472

(22) Filed: Oct. 16, 2003

(65) Prior Publication Data

US 2005/0083649 A1    Apr. 21, 2005

(51) Int. Cl.[7] .............................................. F25B 39/04
(52) U.S. Cl. ...................... 55/385.6; 55/385.1; 55/496; 55/500; 55/511; 55/385.7; 55/471; 454/184; 62/259.1; 62/507; 206/316.3; 416/247 R; 361/687; 361/800; 174/50
(58) Field of Search ........................... 55/385.6, 385.1, 55/496, 500, 511, 385.7, 471; 454/184; 62/259.1, 62/507; 206/316.3; 416/247 R; 361/687, 361/800; 174/50

(56) References Cited

U.S. PATENT DOCUMENTS

| 5,529,184 | A | 6/1996 | Sadow |
| 5,931,297 | A | 8/1999 | Weill et al. |
| 5,938,096 | A | 8/1999 | Sauer et al. |
| 6,149,001 | A | 11/2000 | Akins |
| 6,171,357 | B1 * | 1/2001 | Guttmann ................... 55/385.7 |
| 6,544,309 | B1 * | 4/2003 | Hoefer et al. .................. 55/283 |
| 6,552,900 | B1 * | 4/2003 | Hoefer et al. ................ 361/695 |
| 6,699,301 | B1 * | 3/2004 | Eisenhauer ................... 55/471 |
| 6,705,787 | B2 * | 3/2004 | Jeffries et al. ................ 400/714 |
| 6,776,706 | B2 * | 8/2004 | Kipka et al. ................ 454/184 |
| 6,780,216 | B2 * | 8/2004 | Kiilunen .................... 55/385.6 |
| 2001/0041088 | A1 | 11/2001 | Lebeau et al. |
| 2002/0185395 | A1 | 12/2002 | Lindamood |

OTHER PUBLICATIONS http://www.ishubi.com/notebook-accessary/products-cover.asp.
http://www.policecomputersupplies.com/keyboardskins.html.

* cited by examiner

*Primary Examiner*—Minh-Chau T. Pham
(74) *Attorney, Agent, or Firm*—Leslie J. Payne

(57) ABSTRACT

There is disclosed an apparatus and method for protecting electronic devices against excessive heat build-up and particulate infiltration while implementing EMC shielding.

14 Claims, 3 Drawing Sheets

METHOD AND APPARATUS FOR PROTECTING ELECTRONIC DEVICES AGAINST PARTICULATE INFILTRATION, EXCESSIVE HEAT BUILD-UP, AND FOR IMPLEMENTING EMC SHIELDING

BACKGROUND OF THE INVENTION

The present invention relates generally to an apparatus and method for protecting electronic devices against excessive heat build-up and airborne particulate infiltration while implementing EMC shielding.

Electronic components, such as microprocessors and integrated circuits, must operate within certain specified temperature ranges to perform efficiently. Excessive heat, however, degrades their performance, reliability, life expectancy, and even causes failure. For controlling heat in electronic devices, such as computer systems including laptop computers, ambient air is typically drawn into a computer's housing through multiple inlet paths. This is done by internal air-moving devices, drawing the air in before being vented. Because of the pervasive nature of laptop computers, there is a growing demand that they be used in a number of diverse environments including relatively harsh field conditions, such as deserts or the like. However, airborne sand infiltration and high temperatures are major issues. Particulate infiltration potentially results in limited adequate air exchange for the computer's cooling system as well as potential damage to such a system. The problems of infiltration are enhanced when a laptop operates in excessive heat conditions. Thus, the ability to maintain the laptop cool enough to function properly is adversely affected under such circumstances.

One known solution for solving the foregoing issues utilizes a fully sealed computer chassis. Because no air is exchanged between an internal region of the chassis and ambient, an entirely different computer package must be configured. This kind of solution utilizes relatively complicated cooling solutions (e.g., water-cooling). Hence, a fully sealed computer chassis is costly and time-consuming to design and manufacture.

Another known approach utilizes a rigid walled outer enclosure for the computer device. This added enclosure includes one or more booster fans and a filtration system for drawing and filtering outside air into the enclosure before delivering it to the computer device. Significant drawbacks inherent in this kind of approach include costly tooling, as well as power and monitoring issues associated with additional active electronic air-moving devices.

Additionally, it is extremely important to prevent the detection of electronic emissions of a computer system, such as interception of emissions emanating from computer systems used for military purposes in the desert or other field conditions.

Accordingly, the true potential of electronic devices is unrealized if they cannot function satisfactorily in airborne particulate-laden and heated environments without failing. Additionally, without being able to achieve the foregoing in a manner that effectively provides EMC shielding for preventing detection of electronic emissions, the full potential of uses for such electronic devices is also unrealized.

SUMMARY OF THE INVENTION

The present invention provides an enhanced apparatus and method that are particularly adapted for protecting electronic devices in a manner substantially without negative effect to overcome many of the disadvantages of prior art arrangements.

In one illustrated embodiment, there is provided a protective enclosure for enclosing an electronic device. Included in the protective enclosure is a filter assembly that enables controlled airflow, and traps particulate entrained in the airflow, as well as provides EMC shielding for the electronic device. In another preferred embodiment, the EMC shielding is effective for suppressing external detection of electromagnetic emissions from the electronic device.

An aspect of this invention is that it satisfactorily addresses problems of existing computer systems by allowing air exchange between the chassis and external environments in airborne particulate environments without compromising performance or even prematurely failing.

A still further aspect of the present invention is a protective enclosure that provides for a relatively low-pressure drop, which allows for cooling an electronic device by an internal air-moving device of the electronic device, while collecting airborne particulate material occurring in a wide range of sizes.

A still further aspect of the present invention is that the protective enclosure provides a flexible and scalable construction that can be fit over electronic devices having multiple sizes and form factors including laptops and large server rack installations.

A still further aspect of the present invention is that the protective enclosure is portable and requires no costly alterations to existing electronic devices.

A still further aspect of the present invention is that it is foldable and compressible, thereby minimizing storage space thereof.

A still further aspect of the present invention is that it is low cost and readily disposable.

A still further aspect of the present invention is that it is retrofittable.

A still further aspect of the present invention is that the protective enclosure includes a keyboard cover portion that allows an operator to easily manipulate a keyboard of the electronic device.

A yet further aspect of the present invention is that the protective enclosure includes internal projections that assist in defining an air space surrounding the electronic device for air control management.

A still further aspect of the present invention is that the protective enclosure includes a closable opening for an external pluggable part or the like, which effectively seals against particulate infiltration about the pluggable part when plugged.

The aspects described herein are merely a few of several that can be achieved by using the present invention. The foregoing descriptions do not suggest, however, that the invention must be used only in a manner to attain the foregoing aspects.

These and other features and aspects of the present invention will be more fully understood from the following detailed description of the preferred embodiments, which should be read in light of the accompanying drawings. It should also be understood that both the foregoing generalized description and the following detailed description are exemplary, and are not restrictive of the invention.

DETAILED DESCRIPTION

Figure 1:
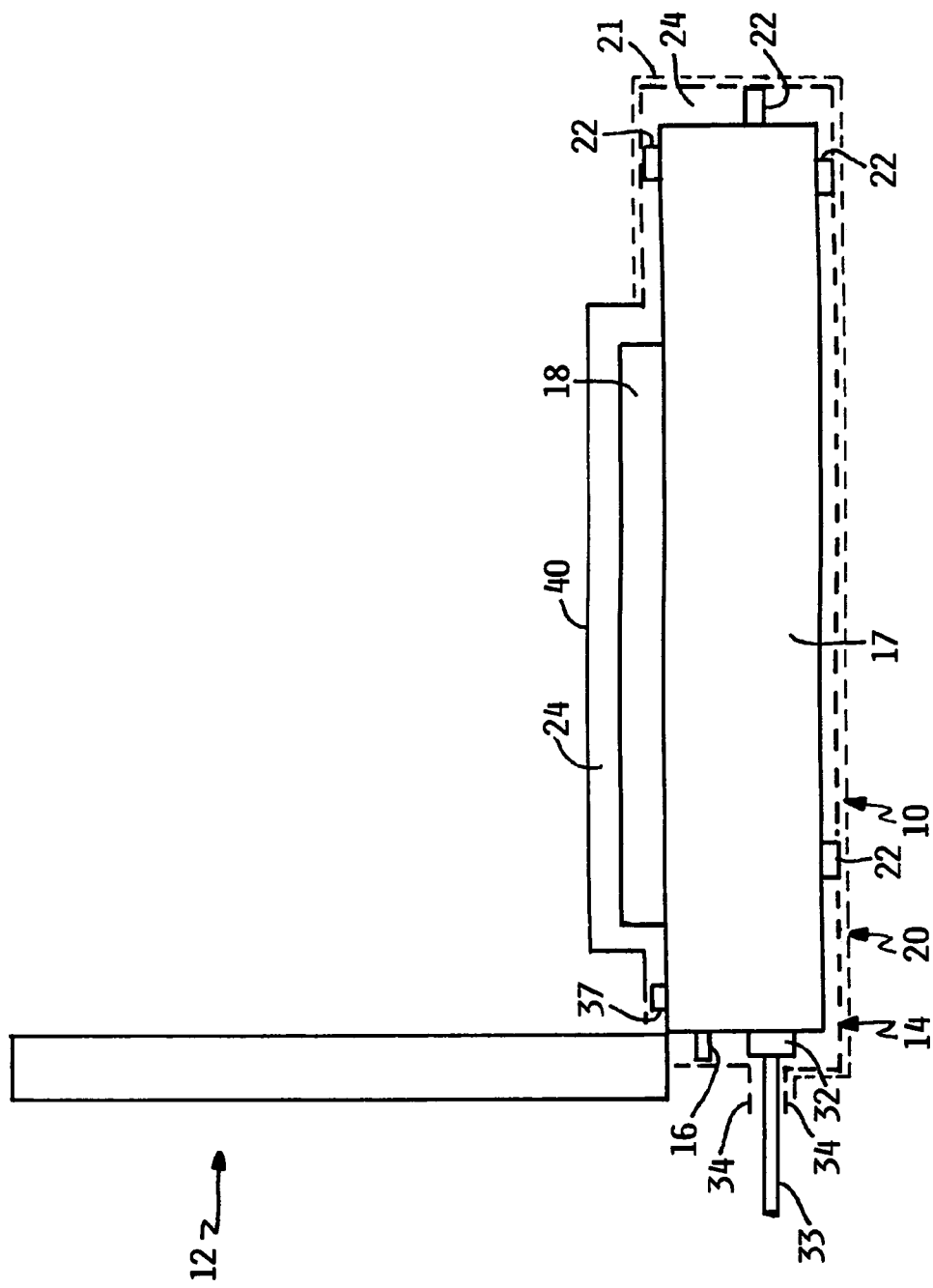
FIG. 1 is a schematic view of one preferred embodiment of a protective enclosure of the present invention.

Reference is made to FIG. 1 for illustrating one of the preferred embodiments of a protective apparatus or enclosure 10 made according to the present invention for protecting electronic devices. The protective enclosure 10 is particularly adapted for use, in combination, with an electronic device 12, such as a laptop computer 12. While a laptop computer 12 is illustrated, it will be appreciated that the protective enclosure 10 is envisioned to be scalable to encompass all or a portion(s) of a suitable electronic device having different sizes and form factors. The electronic devices 12, preferably, contain internal air-moving devices and can be selected from a group consisting of a PC, a server, a client, a terminal, a mainframe, a PDA, and a laptop. The invention is not, however, limited to air cooled electronic devices.

The protective enclosure 10 comprises a filter assembly 14. Preferably, the filter assembly 14 is defined by a bag type construction with at least one open-ended portion 16. The open-ended portion 16 is configured and constructed for fitting over a laptop chassis 17 including a keypad 18, or keyboard portion 18 of the laptop computer 12. In this embodiment, the filter assembly 14 can be comprised of one or more filtration layer(s) 20. The filtration layer 20 essentially serves to remove dust, sand, and other particulate and debris of sizes typically entrained in the ambient airflow while maintaining a relatively low pressure drop and collect particulate having a wide range of sizes. The filtration layer 20 can have a flexible construction to be compliant to the size and shape of the electronic device. In addition, the filtration layer 20 can be comprised of several discrete layers or panels (not shown) that are joined together by any suitable means. Additionally, the filtration layer 20 is flexible, lowweight, foldable, and is capable of compact storage, which provides benefits for military and aerospace purposes. The protective enclosure is also retrofittable.

The filtration layer 20 provides a volumetric filtered airflow rate that will sustain the airflow necessary for cooling the electronic device as required by the device's internal air-moving device by minimizing the pressure drop across the filtration layer, while trapping the entrained sand or other particulate of a wide range of sizes including submicron particles. For example, the filtration layer 20 is, preferred, to be a filter medium made of a blended, synthetic fibrous material that is electrically charged. An exemplary embodiment of the filtration layer 20 is an electrostatically charged, non-woven, and synthetic filter media. In such an embodiment, the blend is comprised of an electrostatically charged needle-felt sandwiched between two electrically dissimilar synthetic polymer fibers, which are specially prepared and processed at the manufacturing stage to create a charge transfer between the two different types of polymers. As one of the fibers in the blend is an effective insulator, the charge transfer is stable and permanent. The surface charging enhances the filtration efficiency. In one embodiment, for example, one of the polymers includes fibers made from polypropylene and the other polymer includes fibers made from polyacrylonitrile. Such a filtration layer 20 is available from Hollingsworth & Vose Air Filtration Ltd. of Cumbria, England, UK. In one embodiment, such a layer can have filtration performance with a nominal NaCl penetration @ 95 liters/minute of less than 10% for 0.65 micron particles according to the method described in BS4400 (a known standard), where the filter media pressure drop is less than 20 Pascals for a filter size of 10×10 centimeters. Such media would provide filtration performance compatible for use with a laptop computer, such as is available from International Business Machines Corporation, Armonk, N.Y. As a result, it would not be necessary to change the internal air-moving devices of such a computer in order to function in environments, such as the desert. Cellulose, glass fibers and other suitable synthetic materials having electret or electrically charged properties can be used as well. While electrically charged materials can be used, the present invention is not limited thereto. It will be appreciated, however, that whatever materials are selected, they should provide filtration performance that minimizes airflow resistance so that the computer system does not have to be modified to incorporate more powerful internal air-moving devices. In addition, they should have high efficiency for trapping or collecting particles of the range of sizes desired including sub-micron particles.

In another exemplary embodiment, the illustrated filter assembly 14 includes one or more electrically conductive elements 21 for providing the EMC shielding that are integrated with the filtration layer 20. The electrically conductive elements 21 are, preferably, in a laminate construction as an outer layer on an external surface of the filtration layer 20. Preferably, the electrically conductive elements 21 can be a nickel/copper polyester knitted mesh. The mesh of conductive elements 21 is made of a known type including polyester threads treated with copper electroless plating with a nickel plating over the top threads. Also contemplated are other conductive meshes, ripstop, wire meshes, conductive threads or the like which can provide for the shielding. In the illustrated embodiment, the conductive elements 21 provide EMC shielding effective for, preferably, suppressing external detection of electromagnetic emissions from the electronic device (laptop computer). Alternatively, the filtration layer 20 can be comprised essentially of electrically conductive threads that are utilized for the EMC shielding. It will be further understood that the kind, amount, and extent of the electrically conductive threads will determine the extent of the EMC shielding. Of course, other equivalent filtration media are envisioned including those yet to be developed. While conductive threads are preferred, other conductive elements can be integrated with the filter in any number of ways. Besides being non-woven or woven, the conductive elements can be formed in a variety of shapes and sizes as well as coupled or otherwise joined to the filtration layer in any appropriate fashion and at discrete locations. The materials for the conductive elements should be selected in accordance with achieving desired EMC performance characteristics contemplated. The present invention contemplates a multilayer construction for affecting the preselected EMC performance characteristics. The different layers can have different EMC materials added to provide for the EMC shielding. The separate layers can have, for example, insulating material therebetween. In addition, the EMC shielding can be modified, as is known, by the manner in which the conductive elements are geometrically arranged with respect to each other.

Whatever the construction of the filtration layer 20, it should be sufficiently air permeable or porous enough to enable desired volumetric filtered airflow rates to satisfy the requirements of the internal air-moving devices of the laptop computer. It will also be readily appreciated that the greater the surface area of the filtration layer 20, the lower the pressure drop across the protective enclosure. Accordingly, filtered airflow can be delivered to the computer without adding air-moving devices to the electronic device. Maintenance of volumetric filtered flow rate is important to heat transfer by forced and natural convection. This invention provides many exemplary approaches for providing a protective enclosure for affecting the desired airflow rates and EMC shielding.

A plurality of projections 22, such as ribs 22 or individual bumps 22, are formed on an internal surface of the filter assembly 14. The projections 22 are adapted to engage an exterior surface of the laptop computer for establishing or creating one or more airspaces 24 between the internal surface of the filter assembly and an outer surface of the laptop chassis 17. The airspace 24 is important in minimizing the pressure drop across the filtration layer as the particle-laden air is pulled through. The projections 22 could be a solid plastic material or other similar material that are bonded or joined otherwise to the inside surface of the filter assembly 14. Additionally, the projections could be formed by pleating the filter material in such a way as to provide the desired projections. The projections 22 provide unobstructed airflow passages around the enclosed laptop chassis 17. The projections 22 may also serve to channel airflow from selected target areas to other areas, and function as standoffs to prevent the filtration layer from collapsing against the laptop chassis 17.

Figure 3:
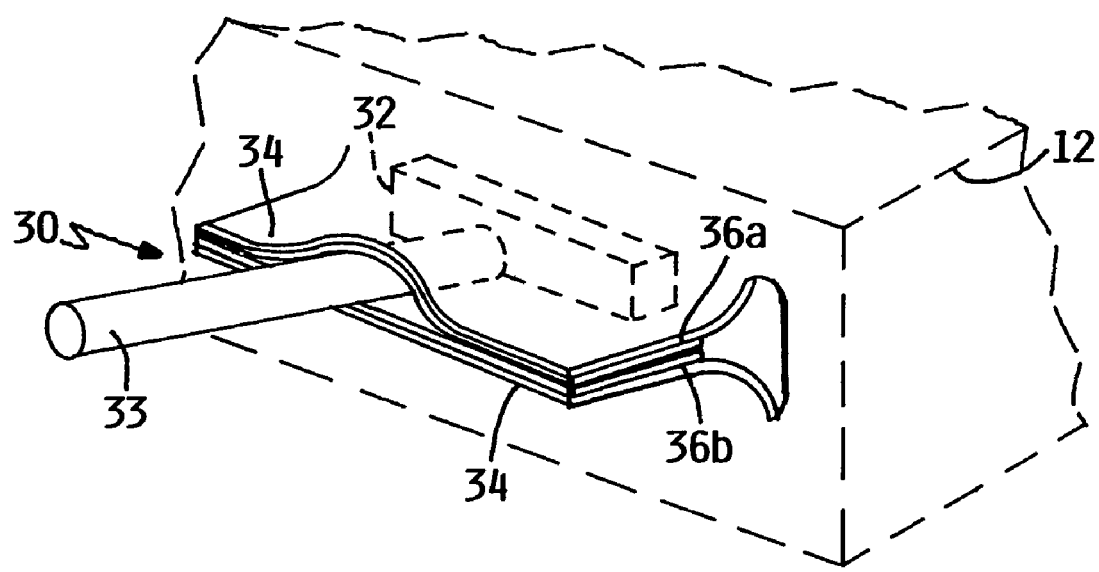
FIG. 3 is a schematic view illustrating a connector coupled to a portable computer according to the present invention.

FIGS. 1 & 3 illustrate at least one I/O closable inlet opening 30 formed in the filter assembly 14 which opening in an open condition receives an electronic part, such as an I/O connector 32 and cable 33. At least a pair of flap portions 34 is included to define the closable inlet of a wall portion. The flap portions 34 allow the I/O closable inlet opening 30 to seal and close, in a manner to be described, when no electronic part, such as the I/O connector 32 is applied. Alternatively, the flap portions 34 are flexible and can conform generally to the outer surface of an I/O connector and cable extending therepast to bring about a sealed condition for limiting EMI and sand/particle infiltration. To assist in this regard, provision is made for mateable hook and loop fastener segments 36a, 36b. The hook and loop fastener segments 36a, 36b are formed on opposing surfaces of the flap portions 34 to allow them to mate in a known manner to effect the closed condition for assisting in sealing the protective enclosure. If it is desired to allow an I/O connector 32 and cable 33 to be received by the laptop computer 12, the hook and loop fastener segments 36a, 36b are separated to an open condition. Once the I/O connector 32 and cable 33 are received, the hook and loop fastener segments 36a, 36b can be re-joined for providing a seal surrounding the connector cable. Although this embodiment discloses hook and loop fastener segments, other releasable fasteners arrangements are contemplated, such as a zipper or the like. A portion of the filter assembly 14 can be attached to the chassis 17 at 37 by a releasable adhesive or the like.

Another aspect of the protective enclosure 10 is the provision of a keyboard panel 40 for mounting over a keyboard of the laptop computer 12. The keyboard panel 40 can be attached to the filtration layer 20 by any suitable means including adhesive bonding, thermal welding, sewing, etc. The keyboard panel 40 is, preferably, a thin, flexible, and transparent plastic material, made of polyethylene, polyurethane or other similar material. Accordingly, a user can manipulate the keyboard 18 when the protective enclosure 10 is in its surrounding relationship. A number of ways are contemplated for securely positioning the keyboard panel 40 in a desired juxtaposed location.

Hence, the filtration layer acts to suppress electromagnetic emissions emanating from the laptop computer 12, whereby detection of electronic emissions can be avoided. Hence, a more secure system is provided. This invention teaches that the level of suppression be varied to achieve different levels of reduction in the electromagnetic emissions. This is highly advantageous in a variety of situations, particularly in military applications wherein security from detection is paramount.

Figure 2:
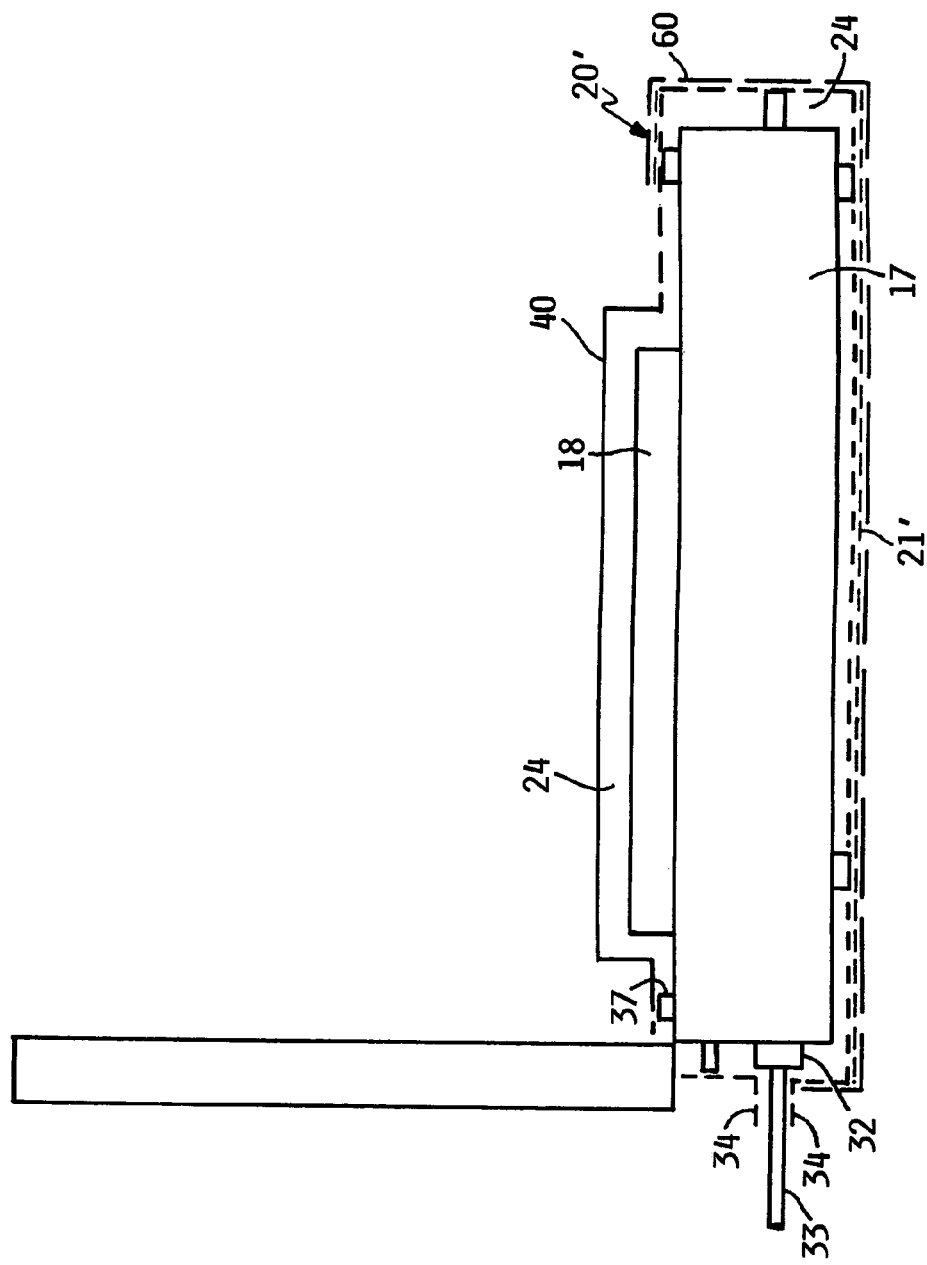
FIG. 2 is a schematic view of another preferred embodiment of a protective enclosure the present invention.

FIG. 2 illustrates another preferred embodiment of a protective enclosure 10' that is made according to this invention. The structures of this embodiment that are the same as the previous embodiment will be represented by the same reference numerals with, however, the addition of a prime marking. This embodiment differs from the preceding embodiment in that the filter assembly 14' is comprised of a laminate construction. The filter assembly 14' comprises an inner filtration layer 20', the conductive mesh 21', conductive elements 21', and an outer scrim layer 60. The outer scrim layer 60 substantially covers the conductive mesh 21', conductive elements 21', and the inner filtration layer 20. The outer scrim layer 60 is joined thereto as by an intermediate adhesive bonding layer (not shown) or the like. The outer scrim layer 60 is, preferably, a wear-resistant scrim layer that adds durability to the overall protective enclosure. The wear-resistant, outer scrim layer 60 possesses air permeability selected in accordance with the requirement not to impede the airflow of entrained particulate through the filtration layer 20. In an exemplary embodiment, the wear-resistant, outer scrim layer 60 is made of a suitable woven or spun bonded polypropylene material. Other types of known protective layers are contemplated to provide desired durability for the protective enclosure while not adversely affecting EMC or impeding airflow. It will be appreciated that various materials can be used for achieving these purposes. In one embodiment, the wear-resistant, outer scrim layer 60 for the laptop computer 12 is selected to be utilized in a variety of outdoor and harsh weather environments (e.g., deserts). Additionally, the wear-resistant, outer scrim layer 60 need not encompass the surface area illustrated, but can encompass different areas at diverse locations (not shown).

It is clear from the foregoing description, that the aforenoted advantages are achieved. Hence, the method and apparatus of this invention enable successful operation of electronic devices without premature failure induced under a wide variety of adverse operating environments including heat and/or particulate laden ambient air typically used for cooling the electronic device. Significantly, operation of the method and apparatus of this invention provide significant benefits because of the EMC shielding suppressing detection of the electronic devices' electronic emissions.

The embodiments and examples set forth herein were presented to explain best the present invention and its practical applications, thereby enabling those skilled in the art to make and use the invention. However, those skilled in the art will recognize that the foregoing description and examples have been presented for the purposes of illustration and example only. The description set forth is not intended to be exhaustive or to limit the invention to the precise forms disclosed. In describing the above-preferred embodiments illustrated in the drawings, specific terminology has been used for the sake of clarity. However, the invention is not intended to be limited to the specific terms selected. It is to be understood that each specific term includes all technical equivalents that operate in a similar manner to accomplish a similar purpose. Many modifications and variations are possible in light of the above teachings without departing from the spirit and scope of the appended claims.

What is claimed is:

1. A protective enclosure for an electronic device, comprising: a flexible filter assembly constructed for at least partially enclosing the electronic device for controlling airflow, trapping particulate of at least a predetermined size entrained in the airflow, and providing EMC shielding for an electronic device, wherein the filter assembly includes a bag construction with at least an open-end portion configured and constructed for fitting over at least a portion of an electronic device, further including at least one flexible portion attached to the filter assembly for placement over a keyboard of an electronic device to allow a user the ability to manipulate the keyboard by pressing on the flexible portion, the filter assembly further includes an inner layer and an outer layer, wherein the outer layer is made of a durable and air permeable material, the outer layer being made of a durable scrim layer, and the outer layer includes electrically conductive material to provide the EMC shielding.

2. The protective enclosure of claim 1, wherein the filter assembly provides EMC shielding effective for suppressing external detection of electromagnetic emissions from an electronic device.

3. The protective enclosure of claim 1 wherein the flexible portion comprises a flexible, transparent, and plastic material.

4. The protective enclosure of claim 1 wherein the filter assembly is constructed to provide a pressure drop which allows for cooling an electronic device by an internal air moving device of the electronic device, while collecting particulate having a predefined range of sizes.

5. The protective enclosure of claim 1 wherein the filter assembly includes at least one wall portion defining a closable inlet for receipt of an electronic part to be connected to an electronic device, wherein when the closable inlet is in an open condition an electronic part has access to an electronic device, and when the closable inlet is in a closed condition the closable inlet provides a seal about a received electronic part.

6. The protective enclosure of claim 1 wherein the filter assembly further includes one or more internal projections for engagement with an electronic device so as to establish one or more airflow spaces surrounding the at least one portion of an electronic device.

7. The protective enclosure of claim 2 wherein the filter assembly includes at least a first layer that is made of a fibrous material including one or more electrostatically charged materials integrated therewith.

8. A method of protecting an electronic device comprising: providing a protective enclosure for at least a portion of an electronic device including a filter assembly for controlling airflow, trapping particulate of at least a predetermined size entrained in the airflow, and providing EMC shielding for an electronic device, wherein the providing for a filter assembly includes providing a bag construction with at least an open-end portion configured and constructed for fitting over the at least a portion of an electronic device; and further fitting the bag construction over the at least a portion of an electronic device, further including providing at least one flexible portion connected to the filter assembly for placement over a keyboard and being constructed to allow a user the ability to manipulate the keyboard by pressing the flexible portion, and wherein the providing of the filter assembly further includes providing an inner layer and an outer layer, wherein the outer layer is made of a durable and air permeable material, the outer layer being made of a durable scrim layer, and the outer layer includes electrically conductive material to provide the EMC shielding.

9. A method according to claim 8 wherein providing EMC shielding is effective for suppressing external detection of electromagnetic emissions from an electronic device.

10. The method of claim 8 wherein the step of providing for the filter assembly includes providing a pressure drop for cooling an electronic device while collecting particulate having a predefined range of sizes.

11. The method of claim 8 further including the step of providing to filter assembly with one or more internal projections for engagement with an electronic device so as to establish one or more airflow spaces surrounding the electronic device.

12. A protective system comprising an electronic device; and a protective enclosure for the electronic device, the protective enclosure comprising: a flexible filter assembly for controlling airflow, trapping particulate of at least a predetermined size entrained in the airflow, and providing EMC shielding for the electronic device, wherein the filter assembly includes a bag construction with at least an open-end portion configured and constructed for fitting over at least a portion of the electronic device, further including at least one flexible portion attached to the filter assembly for placement over a keyboard of the electronic device to allow a user the ability to manipulate the keyboard by pressing on the flexible portion, the filter assembly further includes an inner layer and an outer layer, wherein the outer layer is made of a durable and air permeable material, the outer layer being made of a durable scrim layer, and the outer layer includes electrically conductive material to provide the EMC shielding.

13. The protective system of claim 12, wherein the filter assembly provides EMC shielding effective for suppressing external detection of electromagnetic emissions from the electronic device.

14. The protective system of claim 12, wherein the filter assembly is constructed to provide a pressure drop which allows for cooling the electronic device by an internal air moving device of the electronic device, while collecting particulate having a predefined range of sizes.

* * * * *